(12) United States Patent
Hwang et al.

(10) Patent No.: US 11,626,173 B2
(45) Date of Patent: Apr. 11, 2023

(54) MEMORY DEVICE FOR PERFORMING VERIFY OPERATION AND OPERATING METHOD THEREOF

(71) Applicant: SK hynix Inc., Gyeonggi-do (KR)

(72) Inventors: Sung Hyun Hwang, Gyeonggi-do (KR); Jin Haeng Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/399,792

(22) Filed: Aug. 11, 2021

(65) Prior Publication Data

US 2022/0270697 A1    Aug. 25, 2022

(30) Foreign Application Priority Data

Feb. 25, 2021  (KR) .................. 10-2021-0025570

(51) Int. Cl.
| | | |
|---|---|---|
| *G11C 16/06* | (2006.01) | |
| *G11C 16/34* | (2006.01) | |
| *G11C 16/04* | (2006.01) | |
| *G11C 16/24* | (2006.01) | |
| *G11C 16/10* | (2006.01) | |
| *G11C 11/56* | (2006.01) | |

(52) U.S. Cl.
CPC ...... *G11C 16/3459* (2013.01); *G11C 16/0483* (2013.01); *G11C 16/10* (2013.01); *G11C 16/24* (2013.01); *G11C 11/56* (2013.01)

(58) Field of Classification Search
CPC . G11C 16/3459; G11C 16/0483; G11C 16/10; G11C 16/24; G11C 11/56

USPC ................................................... 365/185.22
See application file for complete search history.

(56) References Cited

U.S. PATENT DOCUMENTS

| | | | | |
|---|---|---|---|---|
| 8,971,116 B1* | 3/2015 | Lim | ................. | G11C 16/28 |
| | | | | 365/185.12 |
| 9,013,924 B2* | 4/2015 | Yang | ................. | G11C 16/0483 |
| | | | | 365/185.17 |
| 2018/0322929 A1* | 11/2018 | Park | ................. | G11C 16/32 |

FOREIGN PATENT DOCUMENTS

| | | |
|---|---|---|
| KR | 10-2019-0060409 A | 6/2019 |
| KR | 10-2019-0073943 A | 6/2019 |

\* cited by examiner

*Primary Examiner* — Tha-O H Bui
(74) *Attorney, Agent, or Firm* — IP & T Group LLP

(57) ABSTRACT

A memory device having an improved operation speed includes: a memory cell; a page buffer connected to the memory cell through a bit line; and a program operation controller for controlling an operation of the page buffer. The page buffer includes: a bit line voltage supply for providing a precharge voltage to the bit line; a sensing node voltage supply for providing a sensing node precharge voltage to a sensing node connected to the bit line; a first latch for storing first verify data; a sensing node connector for releasing connection between the bit line and the sensing node, after the first verify data is stored; and a second latch for storing second verify data determined according to the voltage of the sensing node, after the connection between the bit line and the sensing node is released.

22 Claims, 14 Drawing Sheets

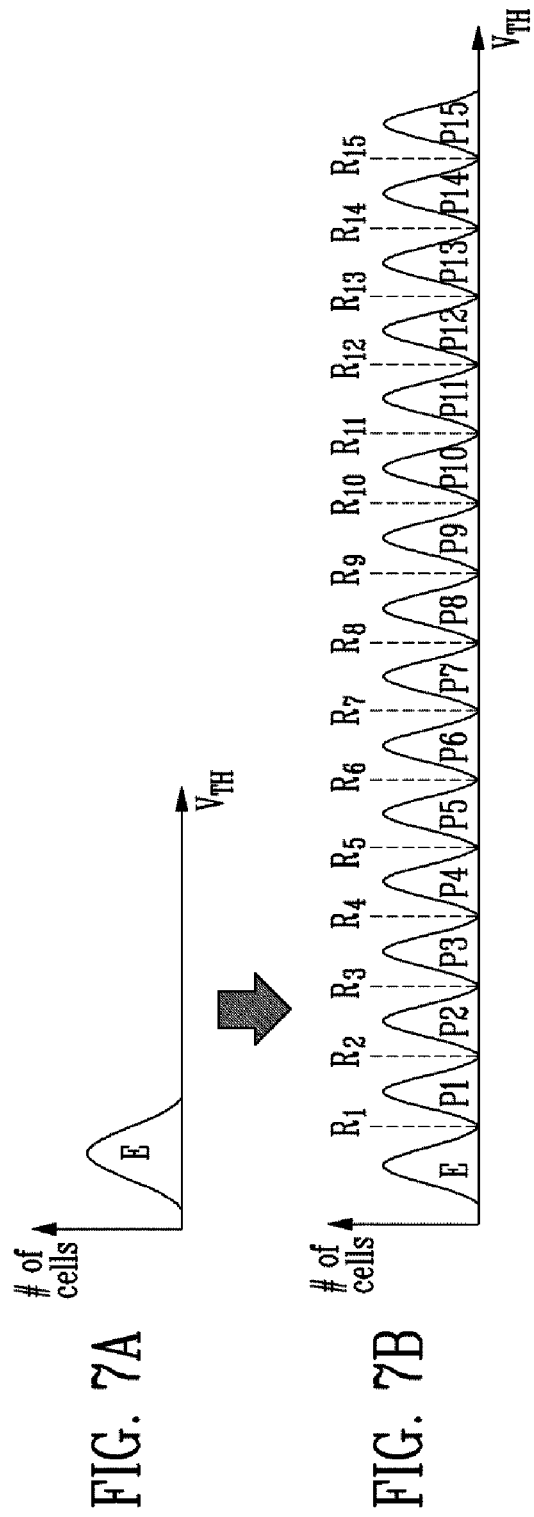

MEMORY DEVICE FOR PERFORMING VERIFY OPERATION AND OPERATING METHOD THEREOF

CROSS-REFERENCE TO RELATED APPLICATION

The present application claims priority under 35 U.S.C. § 119(a) to Korean patent application number 10-2021-0025570 filed on Feb. 25, 2021, in the Korean Intellectual Property Office, the entire disclosure of which is incorporated by reference herein.

BACKGROUND

Field of Invention

The present disclosure generally relates to an electronic device, and more particularly, to a memory device and an operating method thereof.

Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

A volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

A nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments provide a memory device having improved reliability and an improved operation speed, and an operating method of the memory device.

In accordance with one aspect of the present disclosure, there is provided a memory device including: a memory cell; a page buffer circuit connected to the memory cell through a bit line; and a program operation controller configured to control an operation of the page buffer circuit, wherein the page buffer circuit includes: a bit line voltage supply configured to provide a precharge voltage to the bit line while a verify voltage is applied to the memory cell; a sensing node voltage supply configured to provide a sensing node precharge voltage to a sensing node connected to the bit line while the bit line is precharged; a first latch configured to store first verify data determined according to a voltage level of the sensing node, after the sensing node is charged; a sensing node connector configured to release connection between the bit line and the sensing node, after the first verify data is stored; and a second latch configured to store second verify data determined according to the voltage level of the sensing node, after the connection between the bit line and the sensing node is released.

In accordance with another aspect of the present disclosure, there is provided a method for operating a memory device including a memory cell and a page buffer circuit connected to the memory cell through a bit line and including a plurality of latches for storing verify data determined according to a voltage level of a sensing node connected to the bit line, the method including: applying a verify voltage to the memory cell; supplying a precharge voltage to the bit line and a sensing node of the page buffer circuit while the verify voltage is applied; storing, in a first latch, first verify data determined according to the voltage level of the sensing node, until connection between the bit line and the sensing node is released after the sensing node is charged; and storing, in a second latch, second verify data determined according to the voltage level of the sensing node, after the connection between the bit line and the sensing node is released.

In accordance with still another aspect of the present disclosure, there is provided a page buffer circuit connected to a memory cell through a bit line, the page buffer circuit including: a bit line voltage supply configured to provide a precharge voltage to the bit line while a verify voltage is applied to the memory cell; a sensing node voltage supply configured to provide a sensing node precharge voltage to a sensing node connected to the bit line while the bit line is precharged; a first latch configured to store first verify data determined according to a voltage level of the sensing node, after the sensing node is charged; a sensing node connector configured to release connection between the bit line and the sensing node, after the first verify data is stored; and a second latch configured to store second verify data determined according to the voltage level of the sensing node, after the connection between the bit line and the sensing node is released.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 7A and 7B are diagrams illustrating a threshold voltage distribution of quad level cells.

DETAILED DESCRIPTION

The specific structural or functional description disclosed herein is merely illustrative for the purpose of describing various embodiments according to the concepts of the present disclosure. The embodiments according to the concepts of the present disclosure can be implemented in various forms, and the invention should not be construed as limited to the embodiments set forth herein.

Figure 1:
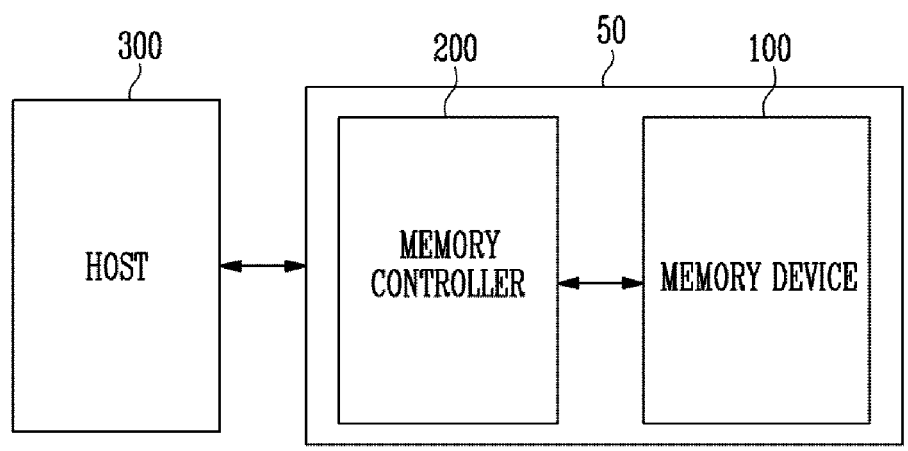
FIG. 1 is a diagram illustrating a storage device including a memory device in accordance with an embodiment of the present disclosure.

FIG. 1 is a diagram illustrating a storage device including a memory device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that is a communication scheme with the host 300. The storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC, a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. The storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may be configured as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. The memory blocks may include a plurality of memory cells. One memory block may include a plurality of pages. In one embodiment, the page may be a unit for storing data in the memory device 100 or reading data stored in the memory device 100. The memory block may be a unit for erasing data.

In one embodiment, the memory device 100 may be for example a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, the memory device 100 is assumed to be a NAND flash memory and so described.

The memory device 100 may receive a command CMD and an address ADDR from the memory controller 200, and access a zone selected by the address ADDR in the memory cell array. The memory device 100 may perform an operation indicated by the command CMD on the zone selected by the address ADDR. For example, the memory device 100 may perform program, read, and erase operations. In the program operation, the memory device 100 may program data in the zone selected by the address ADDR. In the read operation, the memory device 100 may read data from the zone selected by the address ADDR. In the erase operation, the memory device 100 may erase data stored in the zone selected by the address ADDR.

In one embodiment, the memory device 100 may include a plurality of planes. The plane may be a unit independently performing an operation. For example, the memory device 100 may include 2, 4 or 8 planes. The plurality of planes may independently perform program, read, or erase operations at the same time.

The memory controller 200 may control overall operations of the storage device 50.

When power is applied to the storage device 50, the memory controller 200 may execute instructions for example encoded in firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

The memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" may be used with the same meaning. In this specification, the PBA and a "physical address" may be used with the same meaning.

The memory controller 200 may control the memory device 100 to perform program, read, and erase operations, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In one embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In one embodiment, the memory controller 200 may control at least two memory devices 100. The memory controller 200 may control the memory devices according to an interleaving scheme so as to improve operational performance. The interleaving scheme may be a scheme for controlling operations on at least two memory devices 100 to overlap with each other. Alternatively, the interleaving scheme may be a scheme in which at least two memory devices 100 operate in parallel.

A buffer memory may temporarily store data provided from the host 300, i.e., data to be stored in the memory device 100, or temporarily store data read from the memory device 100. In an embodiment, the buffer memory may be a volatile memory device. For example, the buffer memory may be a Dynamic Random Access Memory (DRAM) or a Static Random Access Memory (SRAM).

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
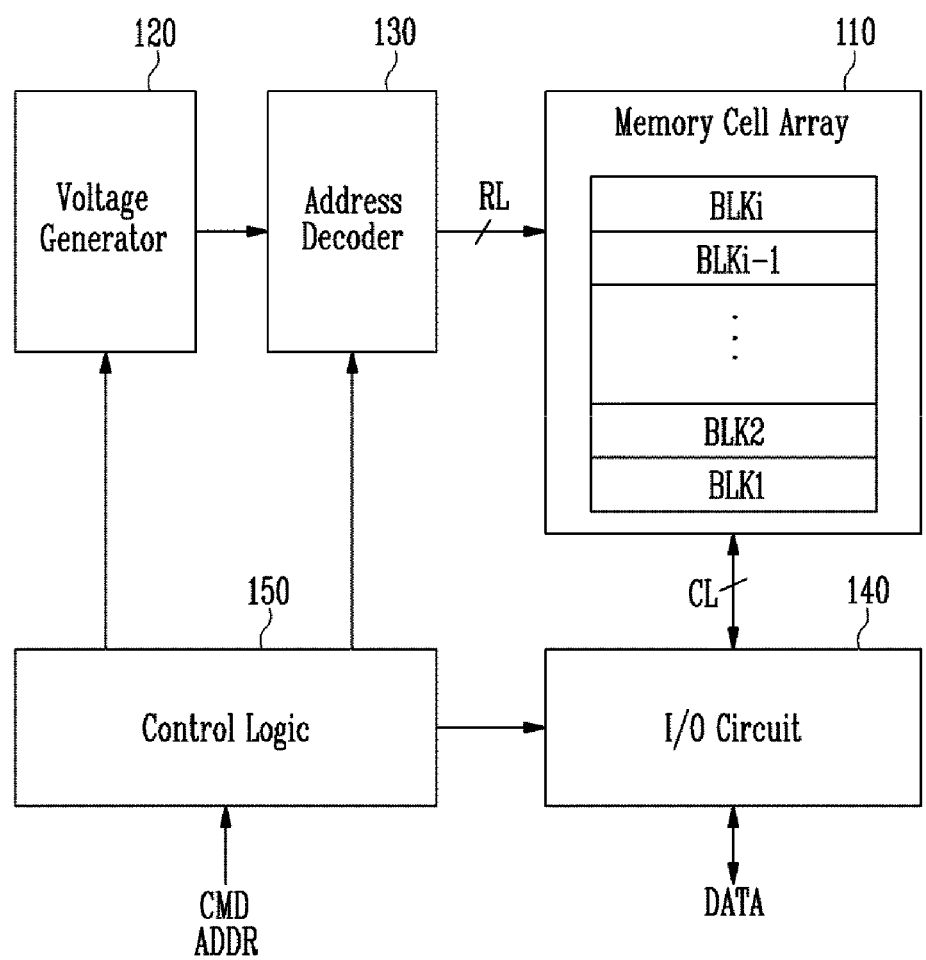
FIG. 2 is a diagram illustrating the memory device shown in FIG. 1.

FIG. 2 is a diagram illustrating the memory device shown in FIG. 1.

Referring to FIG. 2, the memory device 100 may include a memory cell array 110, a voltage generator 120, an address decoder 130, an input/output (I/O) circuit 140, and a control logic 150.

The memory cell array 110 includes a plurality of memory blocks BLK1 to BLKi. The plurality of memory blocks BLK1 to BLKi are connected to the address decoder 130 through row lines RL. The plurality of memory blocks BLK1 to BLKi may be connected to the I/O circuit 140 through column lines CL. In one embodiment, the row lines RL may include word lines, source select lines, and drain select lines. In one embodiment, the column lines CL may include bit lines.

The plurality of memory blocks BLK1 to BLKi includes a plurality of memory cells. In one embodiment, the plurality of memory cells may be nonvolatile memory cells. Memory cells connected to the same word line among the plurality of memory cells may be defined as one physical page. That is, the memory cell array 110 may include a plurality of physical pages. The memory cells of the memory device 100 may be configured for example as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

In one embodiment, the voltage generator 120, the address decoder 130, and the I/O circuit 140 may be commonly designated as a peripheral circuit. The peripheral circuit may drive the memory cell array 110 under the control of the control logic 150. The peripheral circuit may drive the memory cell array 110 to perform program, read, and erase operations.

The voltage generator 120 generates a plurality of operating voltages by using an external power voltage supplied to the memory device 100. The voltage generator 120 operates under the control of the control logic 150.

In one embodiment, the voltage generator 120 may generate an internal power voltage by regulating the external power voltage. The internal power voltage generated by the voltage generator 120 is used as an operating voltage of the memory device 100.

In one embodiment, the voltage generator 120 may generate a plurality of operating voltages by using the external power voltage or the internal power voltage. The voltage generator 120 may generate various voltages required in the memory device 100. For example, the voltage generator 120 may generate a plurality of erase voltages, a plurality of program voltages, a plurality of pass voltages, a plurality of select read voltages, and a plurality of unselect read voltages.

In order to generate a plurality of operating voltages having various voltage levels, the voltage generator 120 may include a plurality of pumping capacitors which receive the internal power voltage, and generate the plurality of operating voltages by selectively activating the plurality of pumping capacitors under the control of the control logic 150.

The plurality of generated operating voltages may be supplied to the memory cell array 110 by the address decoder 130.

The address decoder 130 is connected to the memory cell array 110 through the row lines RL. The address decoder 130 operates under the control of the control logic 150. The address decoder 130 may receive an address ADDR from the control logic 150. The address decoder 130 may decode a block address in the received address ADDR. The address decoder 130 selects at least one memory block from the memory blocks BLK1 to BLKi according to the decoded block address. The address decoder 130 may decode a row address in the received address ADDR. The address decoder 130 may select at least one word line of the selected memory block according to the decoded row address. In an embodiment, the address decoder 130 may decode a column address in the received address ADDR. The address decoder 130 may connect the I/O circuit 140 and the memory cell array 110 to each other according to the decoded column address.

In one embodiment, the address decoder 130 may include components such as a row decoder, a column decoder, and an address decoder.

The I/O circuit 140 may include a plurality of page buffers. The plurality of page buffers may be connected to the memory cell array 110 through the bit lines. In a program operation, data may be stored in selected memory cells according to data stored in the plurality of page buffers.

In a read operation, data stored in the selected memory cells may be sensed through the bit lines, and the sensed data may be stored in the page buffers.

In one embodiment, the control logic 150 may control the address decoder 130, the voltage generator 120, and/or the I/O circuit 140. The control logic 150 may operate in response to a command CMD transferred from an external device. The control logic 150 may control the peripheral circuit by generating control signals in response to the command CMD and the address ADDR.

Figure 3:
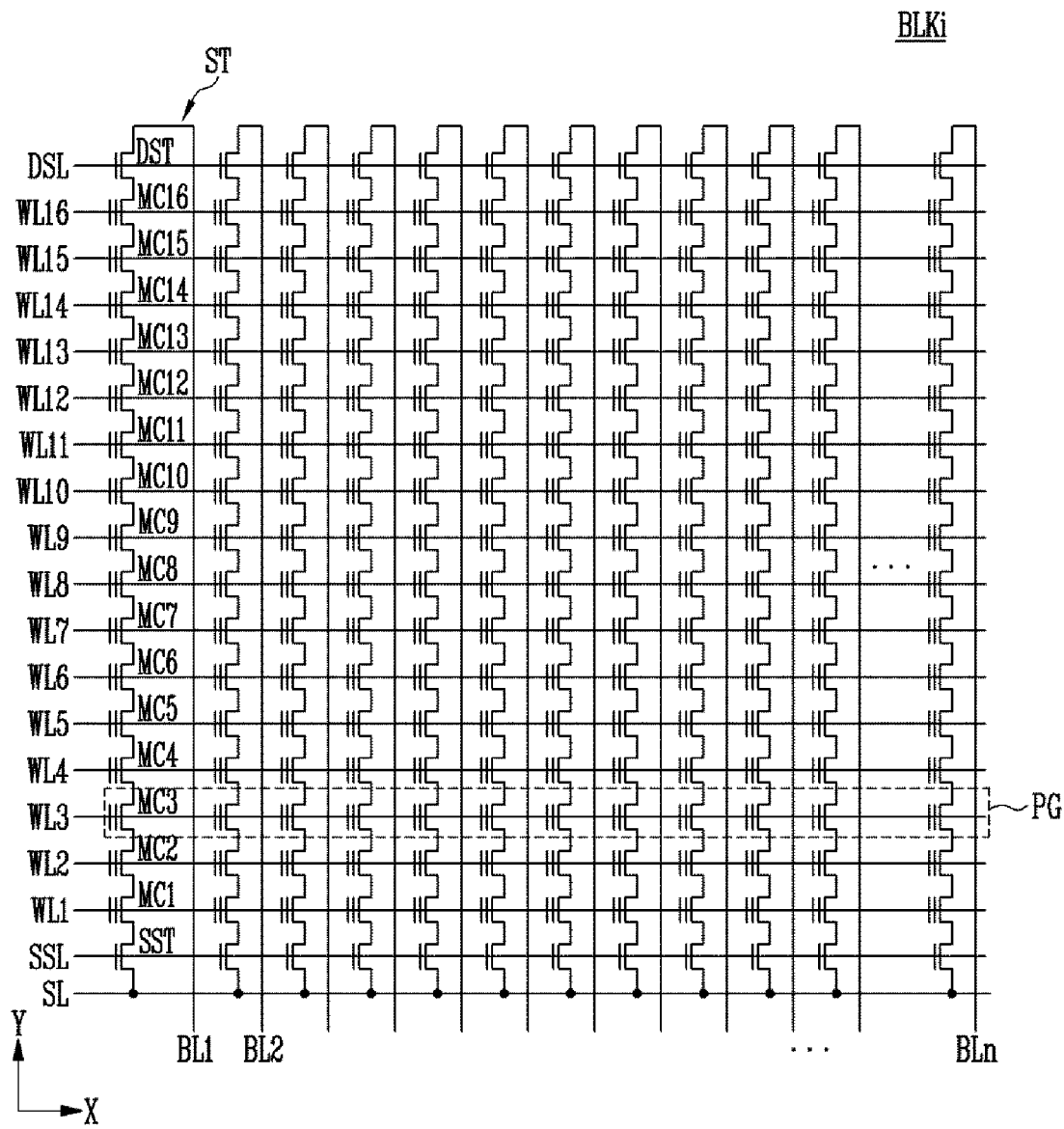
FIG. 3 is a diagram illustrating a structure of any one memory block among memory blocks shown in FIG. 2.

FIG. 3 is a diagram illustrating a structure of any one memory block among the memory blocks shown in FIG. 2.

The memory block BLKi represents any one memory block BLKi among the memory blocks BLK1 to BLKi shown in FIG. 2.

Referring to FIG. 3, in the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MC16, and a drain select transistor DST, which are connected in series to each other between the source line SL and the first bit line BL1. At least one source select transistor SST and at least one drain select transistor DST may be included in one string ST, and memory cells, of which number is greater than that of the memory cells MC1 to MC16 shown in the drawing, may be included in the one string ST.

A source of the source select transistor SST may be connected to the source line SL, and a drain of the drain select transistor DST may be connected to the first bit line BL1. The memory cells MC1 to MC16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells MC1 to MC16 may be connected to a plurality of word lines WL1 to WL16. A group of memory cells connected to the same word line among memory cells included in different strings ST may be referred to as a physical page PG. Therefore, physical pages PG corresponding to the number of the word lines WL1 to WL16 may be included in the memory block BLKi.

One memory cell may store one-bit data. The one memory cell is generally referred to as a single level cell (SLC). One physical page PG may store one logical page (LPG) data. One LPG data may include data bits corresponding to the number of cells included in the one physical page PG.

One memory cell may store two or more-bit data. One physical page PG may store two or more LPG data.

Figure 4A:
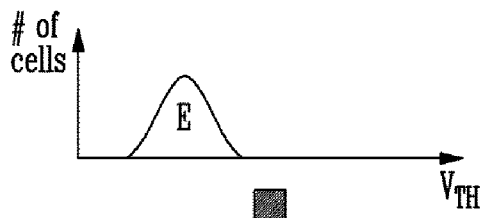
FIGS. 4A and 4B are diagrams illustrating a threshold voltage distribution of single level cells.
Figure 4B:
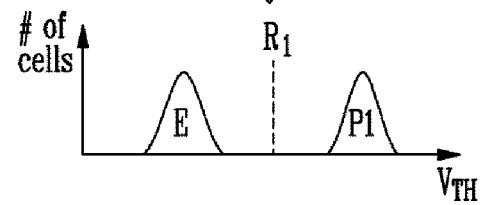

FIGS. 4A and 4B are diagrams illustrating a threshold voltage distribution of single level cells.

Referring to FIGS. 4A and 4B, the horizontal axis represents threshold voltage of memory cells, and the vertical axis represents the number of memory cells.

The memory device may perform a program operation in units of word lines. A plurality of memory cells connected to one word line may constitute one physical page. The physical page may be a unit of a program or read operation.

The memory device may perform a program operation to store data in memory cells connected to a selected word line among a plurality of word lines.

Selected memory cells as the memory cells connected to the selected word line may have a threshold voltage distribution corresponding to an erase state E as shown in FIG. 4A before the program operation is performed.

When a memory cell stores data corresponding to one bit, the memory cell may be programmed to have a threshold voltage corresponding to any one of the erase state E and a first program state P1.

The erase state E may correspond to data '1,' and the first program state P1 may correspond to data '0.' However, the data corresponding to the first program state P1 is merely illustrative. The erase state E may correspond to the data '0,' and the first program state P1 may correspond to the data '1.'

When the program operation is ended, the selected memory cells may have a threshold voltage corresponding to any one of the erase state E and the first program state P1 as shown in FIG. 4B. The memory device performs a read operation using a first read voltage R1 between the erase state E and the first program state P1, so that data stored in the selected memory cells can be read.

Figure 5A:
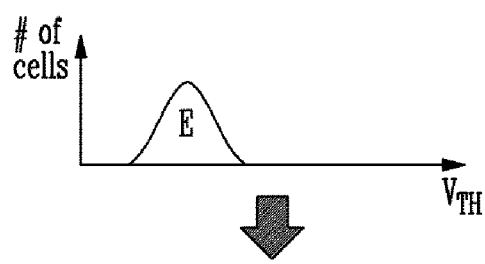
FIGS. 5A and 5B are diagrams illustrating a threshold voltage distribution of multi-level cells.
Figure 5B:
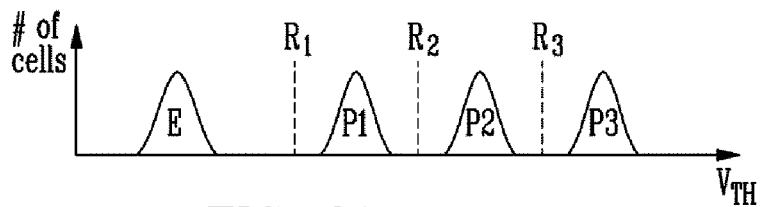

FIGS. 5A and 5B are diagrams illustrating a threshold voltage distribution of multi-level cells.

Referring to FIGS. 5A and 5B, the horizontal axis represents threshold voltage of memory cells, and the vertical axis represents the number of memory cells.

Selected memory cells as the memory cells connected to the selected word line may have a threshold voltage distribution corresponding to an erase state E as shown in FIG. 5A before the program operation is performed.

When a memory cell stores data corresponding to two bits, the memory cell may be programmed to have a threshold voltage corresponding to any one of the erase state E, a first program state P1, a second program state P2, and a third program state P3.

The erase state E may correspond to data '11,' the first program data P1 may correspond to data '10,' the second program data P2 may correspond to data '00,' and the third program state P3 may correspond to data '01.' However, data corresponding to each program state is merely illustrative, and may be variously changed.

When the program operation is ended, the selected memory cells may have a threshold voltage corresponding to any one of the erase state E, the first program state P1, the second program state P2, and the third program state P3 as shown in FIG. 5B. The memory device performs a read operation using first to third read voltages R1 to R3, so that data stored in the selected memory cells can be read.

The first read voltage R1 may be a read voltage for distinguishing the erase state E and the first program state P1 from each other, the second read voltage R2 may be a read voltage for distinguishing the first program state P1 and the second program state P2 from each other, and the third read voltage R3 may be a read voltage for distinguishing the second program state P2 and the third program state P3 from each other.

Figure 6A:
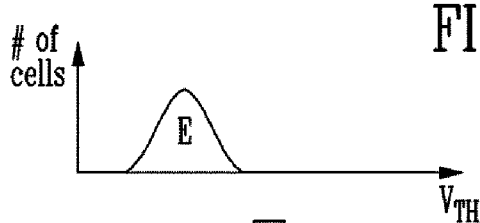
FIGS. 6A and 6B are diagrams illustrating a threshold voltage distribution of triple level cells.
Figure 6B:
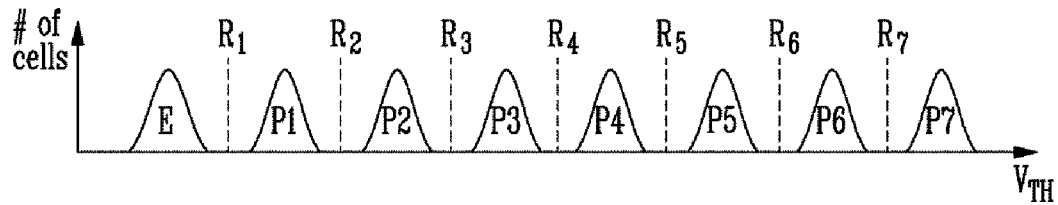

FIGS. 6A and 6B are diagrams illustrating a threshold voltage distribution of triple level cells.

Referring to FIGS. 6A and 6B, the horizontal axis represents threshold voltage of memory cells, and the vertical axis represents number of memory cells.

Selected memory cells as the memory cells connected to the selected word line may have a threshold voltage distribution corresponding to an erase state E as shown in FIG. 6A before the program operation is performed.

When a memory cell stores data corresponding to three bits, the memory cell may be programmed to have a threshold voltage corresponding to any one of the erase state E, a first program state P1, a second program state P2, a third program state P3, a fourth program state P4, a fifth program state P5, a sixth program state P6, and a seventh program state P7.

The erase state E may correspond to data '111,' the first program state P1 may correspond to data '110,' the second program state P2 may correspond to data '101,' the third program state P3 may correspond to data '100,' the fourth program state P4 may correspond to data '011,' the fifth program state P5 may correspond to data '101,' the sixth program data P6 may correspond to data '001,' and the seventh program data P7 may correspond to data '000.' However, data corresponding to each program state is merely illustrative, and may be variously changed.

When the program operation is ended, the selected memory cells may have a threshold voltage corresponding to any one of the erase state E, the first program state P1, the second program state P2, the third program state P3, the fourth program state P4, the fifth program state P5, the sixth program state P6, and the seventh program state P7 as shown in FIG. 6B. The memory device performs a read operation using first to seventh read voltages R1 to R7, so that data stored in the selected memory cells can be read.

The first read voltage R1 may be a read voltage for distinguishing the erase state E and the first program state P1 from each other, the second read voltage R2 may be a read voltage for distinguishing the first program state P1 and the second program state P2 from each other, the third read voltage R3 may be a read voltage for distinguishing the second program state P2 and the third program state P3 from each other, the fourth read voltage R4 may be a read voltage for distinguishing the third program state P3 and the fourth program state P4 from each other, the fifth read voltage R5 may be a read voltage for distinguishing the fourth program state P4 and the fifth program state P5 from each other, the sixth read voltage R6 may be a read voltage for distinguishing the fifth program state P5 and the sixth program state P6 from each other, and the seventh read voltage R7 may be a read voltage for distinguishing the sixth program state P6 and the seventh program state P7 from each other.

FIGS. 7A and 7B are diagrams illustrating a threshold voltage distribution of quad level cells.

Referring to FIGS. 7A and 7B, the horizontal axis represents threshold voltage of memory cells, and the vertical axis represents number of memory cells.

Selected memory cells as the memory cells connected to the selected word line may have a threshold voltage distribution corresponding to an erase state E as shown in FIG. 7A before the program operation is performed.

When a memory cell stores data corresponding to four bits, the memory cell may be programmed to have a threshold voltage corresponding to any one of the erase state E and first to fifteenth program states P1 to P15.

The erase state E may correspond to data '1111,' the first program state P1 may correspond to data '1110,' the second program state P2 may correspond to data '1101,' the third program state P3 may correspond to data '1100,' the fourth program state P4 may correspond to data '1011,' the fifth program state P5 may correspond to data '1010,' the sixth program state P6 may correspond to data '1001,' and the seventh program state P7 may correspond to data '1000.' In addition, the eighth program state P8 may correspond to data '0111,' the ninth program state P9 may correspond to data '0110,' the tenth program state P10 may correspond to data '0101,' the eleventh program state P11 may correspond to data '0100,' the twelfth program state P12 may correspond to data '0011,' the thirteenth program state P13 may correspond to data '0010,' the fourteenth program state P14 may correspond to data '0001,' and the fifteenth program state P15 may correspond to data '0000.' However, data corresponding to each program state is merely illustrative, and may be variously changed.

When the program operation is ended, the selected memory cells may have a threshold voltage corresponding to any one of the erase state E and the first to fifteenth program states P1 to P15 as shown in FIG. 7B. The memory device performs a read operation using first to fifteenth read voltages R1 to R15, so that data stored in the selected memory cells can be read.

The first read voltage R1 may be a read voltage for distinguishing the erase state E and the first program state P1 from each other, the second read voltage R2 may be a read voltage for distinguishing the first program state P1 and the second program state P2 from each other, the third read voltage R3 may be a read voltage for distinguishing the second program state P2 and the third program state P3 from each other, the fourth read voltage R4 may be a read voltage for distinguishing the third program state P3 and the fourth program state P4 from each other, the fifth read voltage R5 may be a read voltage for distinguishing the fourth program state P4 and the fifth program state P5 from each other, the sixth read voltage R6 may be a read voltage for distinguishing the fifth program state P5 and the sixth program state P6 from each other, the seventh read voltage R7 may be a read voltage for distinguishing the sixth program state P6 and the seventh program state P7 from each other, the eighth read voltage R8 may be a read voltage for distinguishing the seventh program state P7 and the eighth program state P8 from each other, the ninth read voltage R9 may be a read voltage for distinguishing the eighth program state P8 and the ninth program state P9 from each other, the tenth read voltage R10 may be a read voltage for distinguishing the ninth program state P9 and the tenth program state P10 from each other, the eleventh read voltage R11 may be a read voltage for distinguishing the tenth program state P10 and the eleventh program state P11 from each other, the twelfth read voltage R12 may be a read voltage for distinguishing the eleventh program state P11 and the twelfth program state P12 from each other, the thirteenth read voltage R13 may be a read voltage for distinguishing the twelfth program state P12 and the thirteenth program state P13 from each other, the fourteenth read voltage R14 may be a read voltage for distinguishing the thirteenth program state P13 and the fourteenth program state P14 from each other, and the fifteenth read voltage R15 may be a read voltage for distinguishing the fourteenth program state P14 and the fifteenth program state P15 from each other.

In the following figures from FIG. 8, it is assumed that each of a plurality of memory cells is a Multi-Level Cell (MLC) storing 2-bit data. However, the scope of the present disclosure is not limited thereto, and the plurality of memory cells may be a Triple Level Cell (TLC) storing 3-bit data or a Quad Level Cell (QLC) storing 4-bit data.

Figure 8:
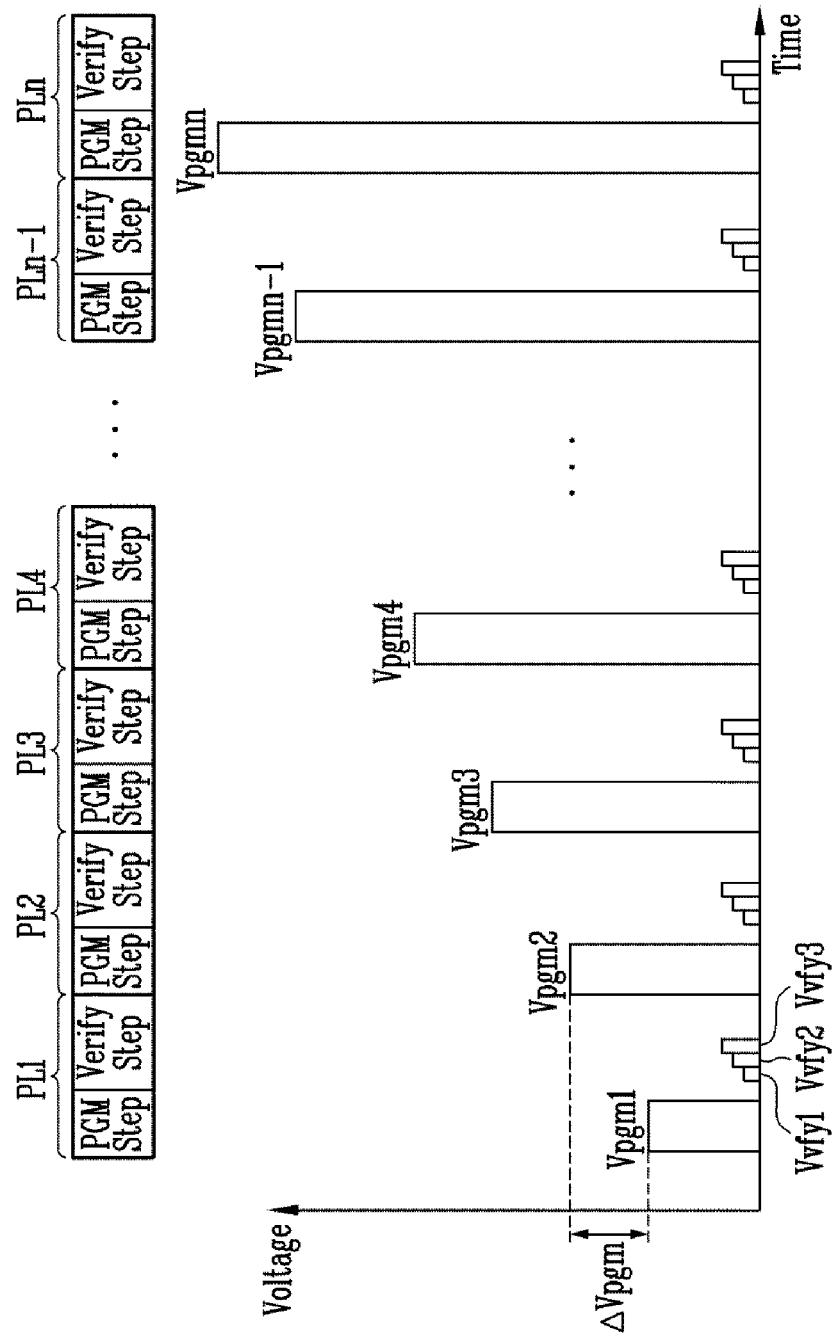
FIG. 8 is a diagram illustrating a program operation.

FIG. 8 is a diagram illustrating a program operation.

In FIG. 8, the program operation of the memory device 100 may include a plurality of program loops PL1 to PLn. That is, the memory device 100 may program selected memory cells to have a threshold voltage corresponding to any one state among a plurality of program states P1, P2, and P3 by performing a plurality of program loops PL1 to PLn.

The plurality of program loops PL1 to PLn may include a program voltage apply step PGM Step of applying a program voltage and a program verify step Verify Step of determining whether memory cells have been programmed by applying verify voltages.

For example, when a first program loop PL1 is performed, first to third verify voltages Vvfy1 to Vvfy3 are sequentially applied to verify a program state of a plurality of memory cells after a first program pulse Vpgm1 is applied. Memory cells of which a target program state is a first program state P1 may be verified by the first verify voltage Vvfy1, memory cells of which a target program state is a second program state P2 may be verified by the second verify voltage Vvfy2, and memory cells of which a target program state is a third program state P3 may be verified by the third verify voltage Vvfy3.

When a threshold voltage of a memory cell is higher than a corresponding one of the verify voltages Vvfy1 to Vvfy3 and thus the memory cell is read as an off-cell, the memory cell may be determined to have a corresponding target program state and therefore may be determined to pass the verify operation, which is referred to as verify pass of the memory cell. That is, verify pass of a memory cell indicates that the memory cell is read as an off-cell by a corresponding verify voltage and thus verify-passed. Then, the verify-passed memory cells may be program-inhibited in a second program loop PL2. A second program pulse Vpgm2 higher by a unit voltage ΔVpgm greater than the first program pulse Vpgm1 is applied so as to program the other memory cells except the memory cells program-inhibited in the second program loop PL2. Subsequently, a verify operation is performed identically to that of the first program loop PL1.

As described above, when the memory device programs a Multi-Level Cell (MLC) storing two bits, the memory device 100 verify memory cells having program states as target program states by respectively using the first to third verify voltages Vvfy1 to Vvfy3.

In a verify operation, a verify voltage is applied to a selected word line as a word line to which selected memory cells are connected, and the page buffer may determine whether memory cells have been verify-passed, based on a current flowing through or a voltage applied to bit lines respectively connected to the selected memory cells.

Figure 9:
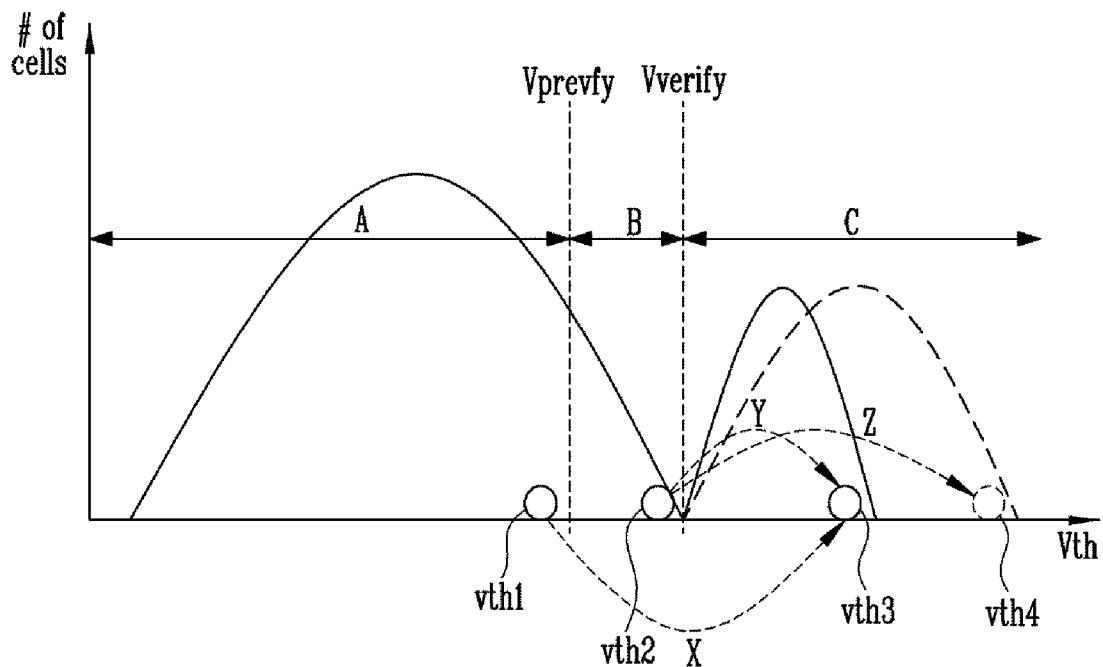
FIG. 9 is a diagram illustrating a double verify operation and tuning of a bit line voltage.

FIG. 9 is a diagram illustrating a double verify operation and a tuning of a bit line voltage.

Referring to FIG. 9, the horizontal axis represents threshold voltage of memory cells, and the vertical axis represents number of memory cells.

In FIG. 9, a verify step of any one program state among the plurality of program states described with reference to FIGS. 4A to 7B will be described as an example.

When a program state is verified by using one verify voltage, the width of a threshold voltage distribution after the program operation is completed may be widened since program speeds of memory cells are different from each other. In order to form a narrower width of the threshold voltage distribution, a method may be used in which two verify voltages are used when one program state is verified. This method is referred to as a double verify program (DPGM).

For a conventional DPGM, in a verify step, an auxiliary verify voltage Vprevfy and a main verify voltage Vverify may be sequentially applied to a selected word line. The main verify voltage Vverify may be any one of the verify voltages described with reference to FIG. 8. When the verify step is performed by using the auxiliary verify voltage Vprevfy and the main verify voltage Vverify, the threshold voltage of a memory cell may be included in any one of zone A, zone B, and zone C.

In one embodiment, a memory cell having a threshold voltage vth1 belonging to the zone A has a threshold voltage lower than even the auxiliary verify voltage Vprevfy. Therefore, the memory cell having a threshold voltage vth1 belonging to the zone A is applied with a relatively high program voltage in a next program loop. A memory cell having a threshold voltage vth2 belonging to the zone B has a threshold voltage which is higher than the auxiliary verify voltage Vprevfy and is lower than the main verify voltage Vverify. Therefore, when the memory cell having a threshold voltage vth2 belonging to the zone B is applied with a relatively low program voltage in a next program loop, the threshold voltage may increase up to vth4. Accordingly, the memory cell having the threshold voltage vth2 belonging to the zone B is to be applied with a program voltage relatively lower than that of the memory cell having the threshold voltage vth1 belonging to the zone A. A memory cell having a threshold voltage vth3 belonging to the zone C has a threshold voltage higher than the main verify voltage Vverify. Therefore, the memory cell having a threshold voltage vth3 belonging to the zone C has been completely programmed and is to be no longer applied with any program voltage in a next program loop. A program voltage is commonly applied to memory cells connected to a selected word line, and therefore, the memory device may tune influence of the program voltage applied to the memory cell by adjusting the bit line voltage, which is referred to as bit line forcing.

After the verify step is performed, a program voltage increased by the unit voltage ΔVpgm may be applied to the selected word line in a next program loop. While the program voltage is applied to the selected word line, a program allow voltage may be applied to a bit line connected to the memory cell having the threshold voltage vth1 belonging to the zone A. In one embodiment, the program allow voltage may be 0V. A program inhibit voltage may be applied to a bit line connected to the memory cell having the threshold voltage vth3 belonging to the zone C. In an embodiment, the program inhibit voltage may have a magnitude of a power voltage Vcc. A program control voltage may be applied to a bit line connected to the memory cell having the threshold voltage vth2 belonging to the zone B. In one embodiment, the program control voltage may have a magnitude which is higher than 0V and is smaller than that of the power voltage Vcc.

As described above, when several verify voltages are used to determine the threshold voltage of the memory cell in the verify step, and the voltages are applied to the bit lines connected to the memory cells in the next program loop, based on a verification result, the width of the threshold voltage distribution can be narrowed. However, the time required in the verify step increases as the number of verify voltages increases.

In one embodiment, even when the verify step is performed by applying only one main verify voltage Vverify, the verification result is stored twice according to the voltage of the bit line changing as time has elapsed. Consequently, the same result as the case where the verify step is performed by using two verify voltages can be achieved.

Figure 10:
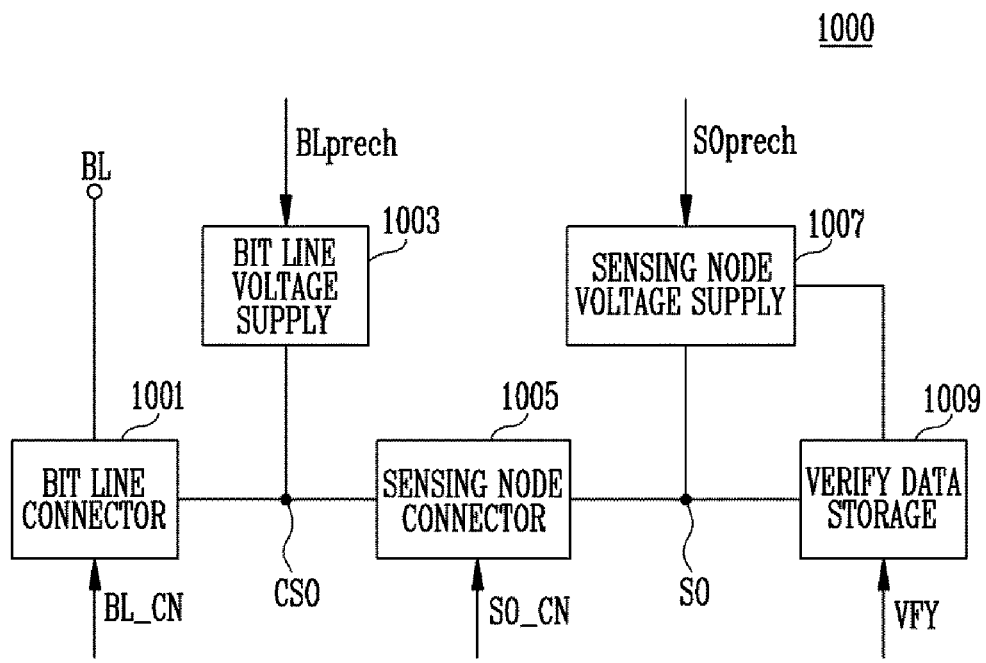
FIG. 10 is a diagram illustrating any one page buffer among a plurality of page buffers included in an input/output circuit shown in FIG. 2.

FIG. 10 is a diagram illustrating any one page buffer 1000 included in the input/output circuit shown in FIG. 2.

Referring to FIG. 10, a memory cell may be connected to the page buffer 1000 through a bit line BL.

The page buffer 1000 may include a bit line connector 1001, a bit line voltage supply 1003, a sensing node connector 1005, a sensing node voltage supply 1007, and a verify data storage 1009.

The bit line connector 1001 may control a connection relationship between a bit line BL connected to a memory cell and a common sensing node CSO. The bit line connector 1001 may receive a bit line connection signal BL_CN, and control connection of the memory cell to the common sensing node CSO in the page buffer 1000 in response to the received bit line connection signal BL_CN.

The bit line voltage supply 1003 may provide a bit line precharge voltage to the common sensing node CSO connected to the bit line. The bit line voltage supply 1003 may receive a bit line charge signal BLprech, and charge the common sensing node CSO connected to the bit line, based on the received bit line charge signal BLprech.

The sensing node connector 1005 may connect the common sensing node CSO (connected to the bit line) to a sensing node SO of the page buffer 1000. The sensing node connector 1005 may receive a sensing node connection signal SO_CN, and may control connection between the common sensing node CSO and the sensing node SO, based on the received sensing node connection signal SO_CN.

The sensing node voltage supply 1007 may provide a sensing node precharge voltage to the sensing node SO. For example, the sensing node voltage supply 1007 may receive a sensing node charge signal SOprech at for example a gate of transistor TR5 (described below), and may activate transistor TR5 permitting charge to flow through for example transistor TR4 shown in FIG. 11 to charge the sensing node SO if the gate of transistor TR4 has signal QS provided thereto as a high voltage level turning on TR4

The verify data storage 1009 may store verify data determined according to a voltage of the sensing node SO. The verify data storage 1009 may receive a verify data storage signal VFY, and store verify data determined according to the voltage of the sensing node SO, based on the received verify data storage signal VFY. The verify data may be stored in a latch.

In accordance with one embodiment of the present disclosure, while a verify voltage is applied to a word line of the memory cell connected to the page buffer 1000 through the bit line BL, the bit line voltage supply 1003 and the sensing node voltage supply 1007 may respectively charge the bit line and the sensing node, and the sensing node connector 1005 may connect the sensing node SO to the common sensing node CSO connected to the bit line. The sensing node SO is connected to the bit line BL through the common sensing node CSO, and therefore, the voltage of the sensing node SO may be linked with a voltage of the bit line BL. Subsequently, the voltage of the bit line BL may be changed according to whether the memory cell connected to the bit line BL is an on-cell or off-cell. Similarly, the voltage of the sensing node SO connected to the bit line BL may be changed. The verify data storage 1009 may store first verify data determined according to the voltage of the sensing node SO, based on a first verify data storage signal VFY_1 received before the connection between the bit line BL and the sensing node SO is released by the sensing node connector 1005, and store second verify data determined according to the voltage of the sensing node SO, based on a second verify data storage signal VFY_2 received after the connection between the bit line BL and the sensing node SO is released by the sensing node connector 1005.

Figure 11:
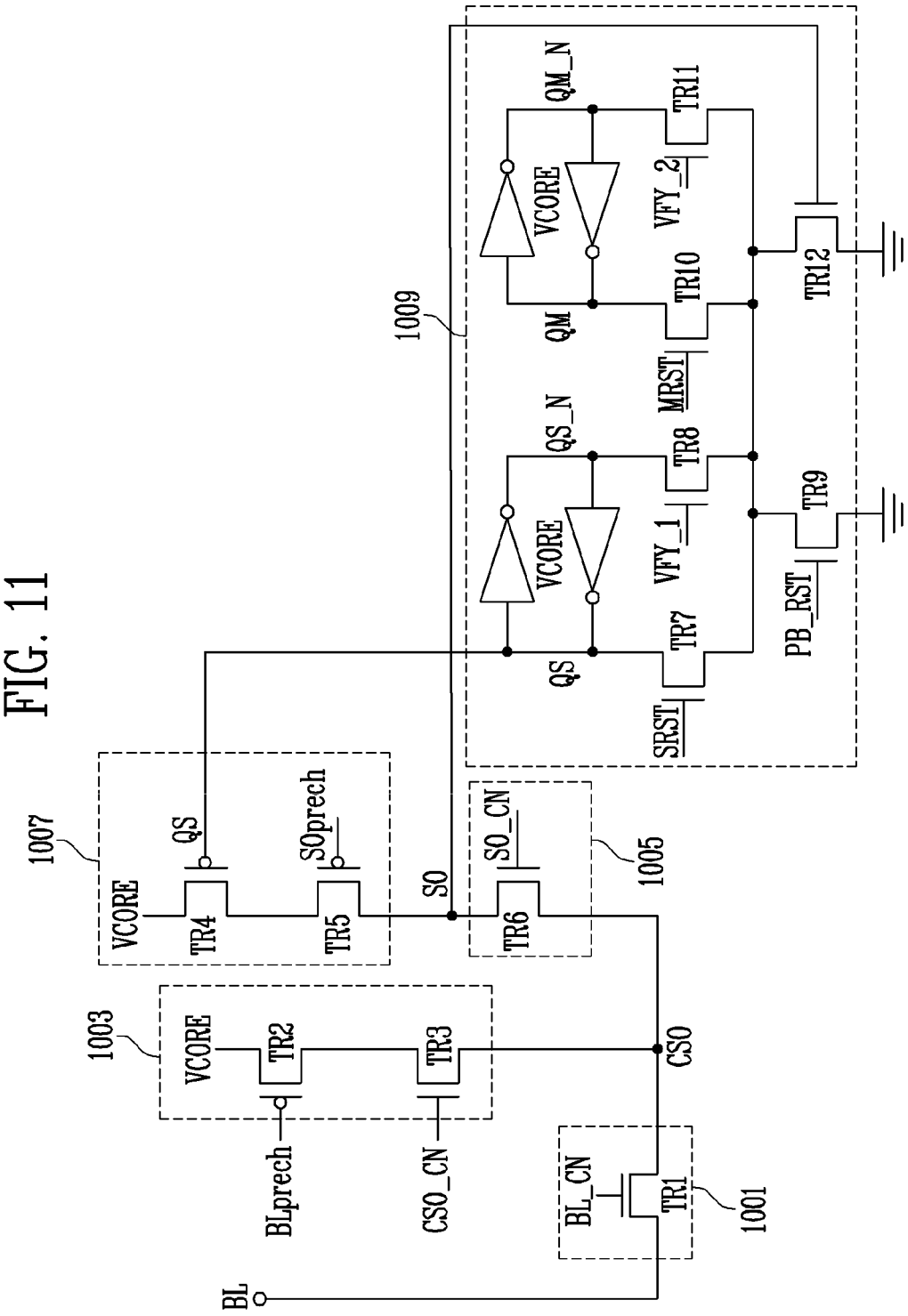
FIG. 11 is an internal circuit diagram of a page buffer in accordance with an embodiment of the present disclosure.

FIG. 11 is an internal circuit diagram of page buffer 1000 in accordance with one embodiment of the present disclosure.

Referring to FIG. 11, the bit line connector 1001, the bit line voltage supply 1003, the sensing node connector 1005, the sensing node supply 1007, and the verify data storage 1009, which are shown in FIG. 10, may be implemented with first to twelfth transistors TR1 to TR12.

The bit line connector 1001 may include the first transistor TR1. The bit line connection signal BL_CN may be input to a gate of the first transistor TR1. The first transistor TR1 may control the connection between the bit line BL and the common sensing node CSO according to the bit line connection signal BL_CN. The first transistor TR1 may be an NMOS transistor.

The bit line voltage supply 1003 may include the second transistor TR2 and the third transistor TR3. The bit line charge signal BLprech may be input to a gate of the second transistor TR2. A common sensing node connection signal CSO_CN may be connected to a gate of the third transistor TR3. The second transistor TR2 may be charged according to the bit line charge signal BLprech, and the third transistor TR3 may charge the common sensing node CSO by controlling connection between the second transistor TR2 and the common sensing node CSO according to the common sensing node connection signal CSO_CN. The second transistor TR2 may be a PMOS transistor, and the third transistor TR3 may be an NMOS transistor.

The sensing node connector 1005 may include the sixth transistor TR6. The sensing node connection signal SO_CN may be input to a gate of the sixth transistor TR6. The sixth transistor TR6 may control the connection between common sensing node CSO and the sensing node SO according to the sensing node connection signal SO_CN. The sixth transistor TR6 may be an NMOS transistor.

The sensing node voltage supply 1007 may include the fourth transistor TR4 and the fifth transistor TR5. The sensing node charge signal SOprech may be input to a gate of the fifth transistor TR5. The fifth transistor TR5 may charge the sensing node SO according to the sensing node charge signal SOprech. The fifth transistor TR5 may be an NMOS transistor.

The verify data storage 1009 may include the seventh transistor TR7, the eighth transistor TR8, the ninth transistor TR9, the tenth transistor TR10, the eleventh transistor TR11, the twelfth transistor TR12, a S latch and a M latch. An S latch reset signal SRST may be input to a gate of the seventh transistor TR7. The first verify data storage signal VFY_1 may be input to a gate of the eighth transistor TR8. A page buffer reset signal PB_RST may be input to a gate of the ninth transistor TR9. An M latch reset signal MRST may be input to a gate of the tenth transistor TR10. When clearing data latched in the S and M latches, the S and M latch reset signals SRST and MRST and the page buffer reset signal PB_RST may turn on the transistors TR7 and TR10 and the transistor TR9, respectively. The second verify data storage signal VFY_2 may be input to a gate of the eleventh transistor TR11. The voltage of the sensing node SO may be input to a gate of the twelfth transistor TR12. The eighth transistor TR8 may control whether to store data in the S latch according to the first verify data storage signal VFY_1.

The eleventh transistor TR11 may control whether to store data in the M latch according to the second verify data storage signal VFY_2. These S and M latches will be referred to as first and second latches, respectively. The seventh transistor TR7 may be an NMOS transistor. The eighth transistor TR8 may be an NMOS transistor. The ninth transistor TR9 may be an NMOS transistor. The tenth transistor TR10 may be an NMOS transistor. The eleventh transistor TR11 may be an NMOS transistor. The twelfth transistor TR12 may be an NMOS transistor.

The twelfth transistor TR12 of the verify data storage 1009 may have different operations according to the voltage of the sensing node SO. When the twelfth transistor TR12 is turned on due to the voltage of the sensing node SO, and the verify data storage 1009 receives the verify data storage signals VFY_1 and VFY_2, the data stored in the latch may be changed. When the twelfth transistor TR12 is turned off due to the voltage of the sensing node SO, the data stored in the latch may not be changed even when the verify data storage 1009 receives the verify data storage signals VFY_1 and VFY_2.

Figure 12:
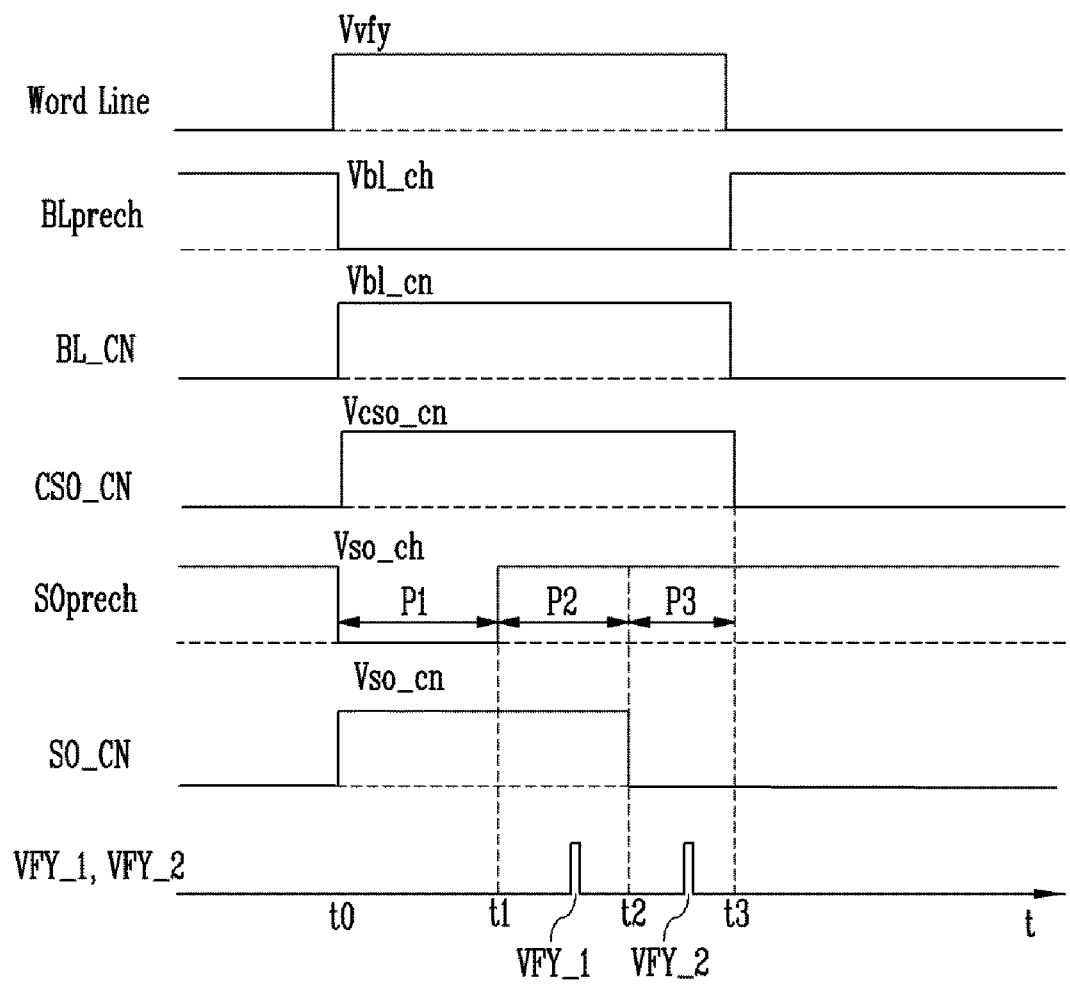
FIG. 12 is a diagram illustrating signals applied to a circuit shown in FIG. 11.

FIG. 12 is a diagram illustrating various control signals applied to the circuit shown in FIG. 11.

Referring to FIGS. 11 and 12, from an initial time point t0 to a third time point t3, a verify voltage Vvfy may be applied to a word line Word Line of the memory cell. At the initial time point t0, the bit line connection signal BL_CN having a logic high level may be applied to the first transistor TR1. The first transistor TR1 may be turned on according to the bit line connection voltage Vbl_cn, and the bit line BL and the common sensing node CSO may be connected to each other.

The bit line charge signal BLprech (having a charge voltage Vbl_ch) at time t0 may change to a logic low level and turn on the second transistor TR2, and the common sensing node connection signal CSO_CN having a logic high level may be applied as a voltage Vcso_cn to the third transistor TR3. The third transistor TR3 may be turned on. The common sensing node CSO connected to the bit line by the second transistor TR2 and the third transistor TR3, which are turned on, may be charged.

The sensing node charge signal SOprech (having a sensing node charge voltage Vso_ch) at time t0 may change to a logic low level and turn on the fifth transistor TR5. The sensing node SO may be charged.

The sensing node connection signal SO_CN having a logic high level at time t0 may be applied as a sensing node connection voltage Vso_cn to the sixth transistor TR6. The sixth transistor TR6 may be turned on, and the common sensing node CSO and the sensing node SO may be connected to each other. Because of the connection between the common sensing node CSO and the sensing node SO, the sensing node SO may be charged to have the voltage level of the common sensing node CSO.

At a first time point t1, the sensing node charge signal SOprech having a logic high level may be applied as a sensing node charge voltage Vso_ch to the fifth transistor TR5. The fifth transistor TR5 may be turned off, and the sensing node SO may be completely charged.

At a second time point t2, the sensing node connection signal SO_CN (having a sensing node connection voltage Vso_cn) may change to a logic low level and turn off the sixth transistor TR6. The connection between the common sensing node CSO and the sensing node SO may be released.

At the third time point t3, since the verify operation is completed, the input of the verify voltage Vvfy to the word line Word Line of the memory cell may be suspended. The bit line connection signal BL_CN (having a bit line voltage Vbl_cn) may change to a logic low level and turn off the first transistor TR1. The connection between the bit line BL and the common sensing node CSO may be released. The common sensing node connection signal CSO_CN may have a logic low level in order to turn off the third transistor TR3. The charging of the common sensing node CSO may be cutoff.

Referring to FIGS. 10 and 11, the sensing node SO may be connected to the common sensing node CSO through the sixth transistor TR6 during the period between the initial and second time points t0 to t2 (refer to the signal SO_CN in FIG. 12), and the common sensing node CSO may be connected to the bit line BL through the first transistor TR1 during the period between the initial and third time points t0 to t3 (refer to the signal BL_CN in FIG. 12). That is, as long as both the first transistor TR1 and the sixth transistor TR6 are turned on, that is, during the period between the initial and second time points t0 to t2, the sensing node SO and the bit line BL may be connected to each other and therefore both the bit line BL and the sensing node SO may be charged to have the voltage level of the common sensing node CSO.

The voltage of the bit line BL may be changed according to a threshold voltage of the memory cell connected to the page buffer from after the first time point t1 at which the sensing node SO is completely charged. The voltage of the sensing node SO connected to the bit line BL may also be changed. The voltage of the bit line BL may be decreased when the threshold voltage of the memory cell is lower than the verify voltage Vvfy. The decreased amount of the voltage of the bit line BL may become greater as the difference between the threshold voltage of the memory cell and the verify voltage Vvfy becomes larger. Referring to FIG. 9, it can be seen that the threshold voltage of memory cells included in the zone A of the memory cells is lowest. The bit line voltage of the memory cells included in the zone A may be most decreased. A decrement of the bit line voltage of memory cells included in the zone B may be smaller than that of the bit line voltage of the memory cells included in the zone A. The bit line voltage of memory cells included in the zone C may be hardly decreased. The voltage of the sensing node SO connected to the bit line BL may also be decreased.

The verify data storage 1009 may store verify data determined according to the voltage of the sensing node SO between the first time point t1 and the third time point t3. Specifically, the verify data storage 1009 may receive the first verify data storage signal VFY_1 between the first time point t1 and the second time point t2, and store, in a first latch that is the S latch illustrated in FIG. 11, the first verify data determined according to the voltage of the sensing node SO. Subsequently, the verify data storage 1009 may receive the second verify data storage signal VFY_2 between the second time point t2 and the third time point t3, and store, in a second latch that is the M latch illustrated in FIG. 11, the second verify data determined according to the voltage of the sensing node SO.

A period from the initial time point t0 to the first time point t1 may be a precharge period P1 of the sensing node SO, a period from the first time point t1 to the second time point t2 may be a first verify period P2, and a period from the second time point t2 to the third time point t3 may be a second verify period P3.

In accordance with one embodiment of the present disclosure, a first verification may be performed in the first verify period P2 as a period after the sensing node SO is completely charged (t1) and before the connection between the sensing node SO and the common sensing node CSO and therefore the connection between the sensing node SO and the bit line BL is released (t2), and a second verification may be performed in the second verify period P3 as a period after the connection between the sensing node SO and the bit line BL is released. In one embodiment, this double verify operation is performed through one-time precharge of the sensing node SO, and thus the operation time of the double verify operation can be reduced.

Figure 13:
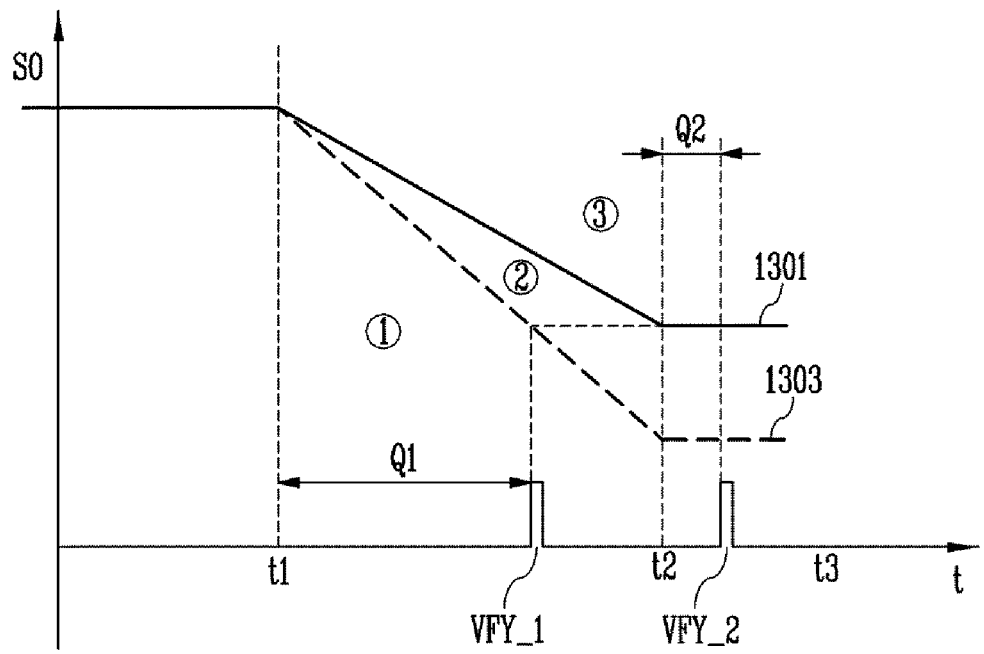
FIG. 13 is a diagram illustrating a method for performing a double verify operation through one-time sensing node precharge in accordance with an embodiment of the present disclosure.

FIG. 13 is a diagram illustrating a method for performing the double verify operation through one-time sensing node precharge in accordance with one embodiment of the present disclosure.

Referring to FIG. 13, the horizontal axis represents time, and the vertical axis represents voltage of the sensing node SO.

The voltage of the sensing node SO may be changed according to the threshold voltage of the memory cell connected to the page buffer from after the first time point t1 at which the sensing node SO is completely charged to the second time point t2 at which the connection between the sensing node SO and the bit line BL is released. Specifically, when the verify voltage Vvfy is applied to the word line coupled to a memory cell, the voltage of the sensing node SO of the memory cell, which has not been completely programmed to a target program state, decreases. The degree of decrease in the voltage of the sensing node SO is changed according to the threshold voltage of the memory cell. A voltage decrement may become smaller as the threshold voltage of the memory cell becomes higher. When the voltage of the sensing node SO of the memory cell does not substantially decrease, it can be regarded that the memory cell is programmed to a target program state.

Referring to FIGS. 10 and 11, in the double verify operation in accordance with one embodiment of the present disclosure, the first verify data storage signal VFY_1 may be applied after a first reference time amount Q1 elapses from the first time point t1. The verify data storage 1009 stores, in the first latch (i.e., the S latch illustrated in FIG. 11), the first verify data determined according to the voltage of the sensing node SO, based on the first verify data storage signal VFY_1. The second verify data storage signal VFY_2 may be applied after a second reference time amount Q2 elapses from the second time point t2. The verify data storage 1009 stores, in the second latch (i.e., the M latch illustrated in FIG. 11), the second verify data determined according to the voltage of the sensing node SO, based on the second verify data storage signal VFY_2.

In FIG. 13, solid line 1301 may represent voltage of the sensing node SO of the memory cell having Vverify shown in FIG. 9 as the threshold voltage, and dotted line 1303 may represent voltage of the sensing node SO of the memory cell having Vprevfy shown in FIG. 9 as the threshold voltage. The dotted line 1303 shown in FIG. 13 may be a first reference voltage associated with the first verify data. The solid line 1301 shown in FIG. 13 may be a second reference voltage associated with the second verify data.

By the solid line 1301 and the dotted line 1303, the internal area of a graph may be divided into area ①, area ②, and area ③. The area 1 in FIG. 13 may correspond to the zone A shown in FIG. 9, the area ② in FIG. 13 may correspond to the zone B shown in FIG. 9, and the area ③ in FIG. 13 may correspond to the zone C shown in FIG. 9. According to the double verify operation in a current program loop, the threshold voltage increment of a memory cell belonging to the area ① may be maintained in the next program loop, and the threshold voltage increment of a memory belonging to the area ② may be adjusted in the next program loop. Since it can be seen that a memory cell belonging to the area ③ is regarded as programmed to a target program state in a current program loop, the memory cell may be regarded as verify-passed and thus any program voltage may not be further applied to the memory cell in the next program loop.

When the first verify data storage signal VFY_1 is applied to the eighth transistor TR8 illustrated in FIG. 11, the verify data storage 1009 may compare the voltage of the sensing node SO with the first reference voltage 1303. When the voltage of the sensing node SO is lower than the first reference voltage 1303, the verify data storage 1009 may store, in the first latch, the first verify data which means a low value or on-cell data. Also, when the voltage of the sensing node SO is higher than or equal to the first reference voltage 1303, the verify data storage 1009 may store, in the first latch, the first verify data which means a high value or off-cell data.

When the second verify data storage signal VFY_2 is applied to the eleventh transistor TR11 illustrated in FIG. 11, the verify data storage 1009 may compare the voltage of the sensing node SO with the second reference voltage 1301. When the voltage of the sensing node SO is lower than the second reference voltage 1301, the verify data storage 1009 may store, in the second latch, the second verify data which means a low value or on-cell data. Also, when the voltage of the sensing node SO is higher than or equal to the second reference voltage 1301, the verify data storage 1009 may store, in the second latch, the second verify data which means a high value or off-cell data.

A voltage applied to the bit line in a next program loop may be determined based on the verify data stored in the first latch and the second latch. For example, when both the first verify data and the second verify data are the low value, the memory cell may correspond to the area ①, and the threshold voltage increment of the memory cell may not be adjusted. A ground voltage (0V) may be applied to the bit line in the next program loop. When the ground voltage 0V is applied, the threshold voltage increment of the memory cell is not adjusted as indicated by "X" of FIG. 9. When the first verify data is the high value and the second verify data is the low value, the memory cell may correspond to the area ②, and the threshold voltage increment of the memory cell may be adjusted. In the next program loop, a predetermined program allow voltage may be applied to the bit line. When the program allow voltage is applied, the threshold voltage increment of the memory cell may be adjusted as indicated by "Y" of FIG. 9. When both the first verify data and the second verify data are the high value, a predetermined program inhibit voltage may be applied to the bit line in the next program loop. When the program inhibit voltage is applied, a corresponding memory cell is verify-passed, and therefore, the threshold voltage of the corresponding memory cell is no longer increased.

In another embodiment of the present disclosure, a voltage applied to the bit line in a next program loop may be determined based on whether the first verify data and the second verify data correspond to off-cell data or on-cell data. The off-cell data may mean that the threshold voltage of the memory cell is higher than a predetermined reference voltage, and the on-cell data may mean that the threshold voltage of the memory cell is lower than the predetermined reference voltage. A reference voltage of the first verify data may be the first reference voltage 1303. A reference voltage of the second verify data may be the second reference voltage 1301. Specifically, when the first verify data is the on-cell data and the second verify data is the on-cell data, a ground voltage (0V) may be applied to the bit line. When the ground voltage (0V) is applied, the threshold voltage increment of the memory cell is not adjusted as indicated by "X" of FIG. 9. When the first verify data is the off-cell data and the second verify data is the on-cell data, a predetermined program allow voltage may be applied to the bit line. When the program allow voltage is applied, the threshold voltage increment of the memory cell may be adjusted as indicated by "Y" of FIG. 9. When the first verify data is the off-cell data and the second verify data is the off-cell data, a predetermined program inhibit voltage may be applied to the bit line. When the program inhibit voltage is applied, a corresponding memory cell is verify-passed, and therefore, the threshold voltage of the corresponding memory cell is no longer increased.

In accordance with one embodiment of the present disclosure, the first reference time amount Q1 as a period from the first time point t1 to until the first verify data storage signal VFY_1 is applied may be equal to the second reference time amount Q2 as a period from the second time point t2 to until the second verify data storage signal VFY_2 is applied. In another embodiment, the first reference time amount Q1 may be longer or shorter than the second reference time amount Q2. After the first time point t1, a change in the voltage of the sensing node SO may be further increased as the first reference time amount Q1 becomes longer. After the second time point t2, a change in the voltage of the sensing node SO is irrelevant to the length of the second reference time amount Q2.

Figure 14:
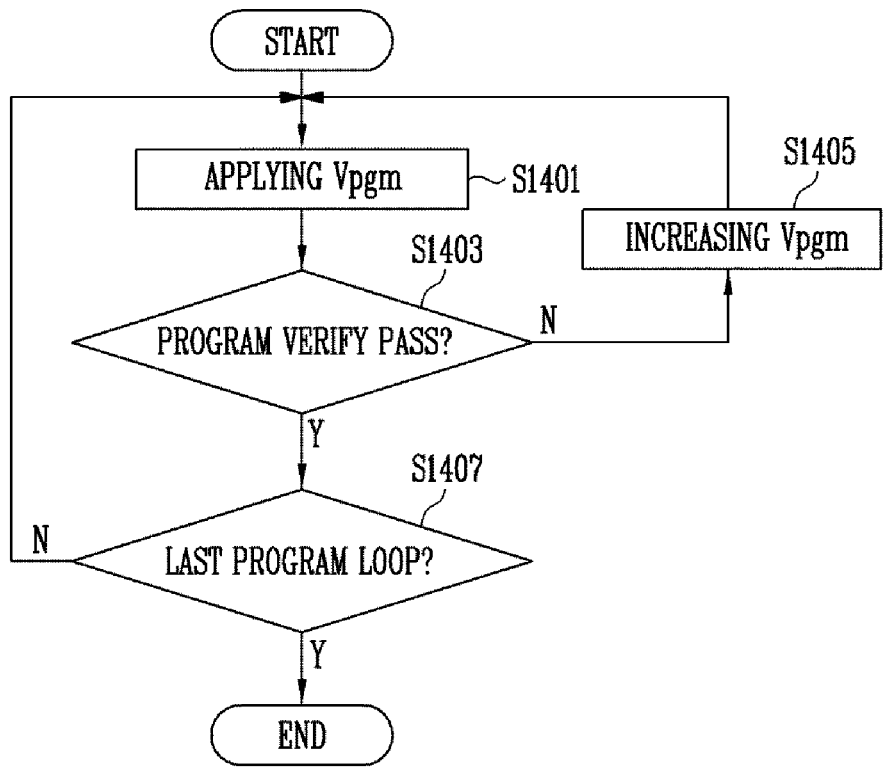
FIG. 14 is a flowchart illustrating an operating method of the memory device in accordance with an embodiment of the present disclosure.

FIG. 14 is a flowchart illustrating an operating method of the memory device in accordance with one embodiment of the present disclosure.

In this embodiment, a program voltage Vpgm may be applied to a memory cell. According to a program verify pass of the memory cells, a program loop may be ended, or a next program loop may be performed.

First, in step S1401, the memory device 100 applies a program voltage Vpgm to a memory cell. Since memory cells have different characteristics, the memory cells may have different threshold voltages, even when the same program voltage Vpgm is applied. In step S1403, the memory device 100 determines a program verify pass of the memory cell. The memory device 100 may determine the program verify pass by performing a double verify operation in the step S1403. The step S1403 will be described in detail in the following FIG. 15.

With respect to a memory cell which is not verify-passed, the memory device 100 may increase the program voltage Vpgm by a predetermined unit voltage ΔVpgm in a next program loop (S1405). In the step S1405, the memory device 100 may change a voltage applied to a bit line in the next program loop, based on a program state of the memory cell. The changing of the voltage applied to the bit line may correspond to the descriptions shown in FIGS. 9 and 13.

When the memory cell is verify-passed in the current program loop, the memory device 100 may end the current program loop or apply the program voltage Vpgm to the memory cell in a next program loop (S1401) by determining whether the current program loop is a last program loop (S1407).

Figure 15:
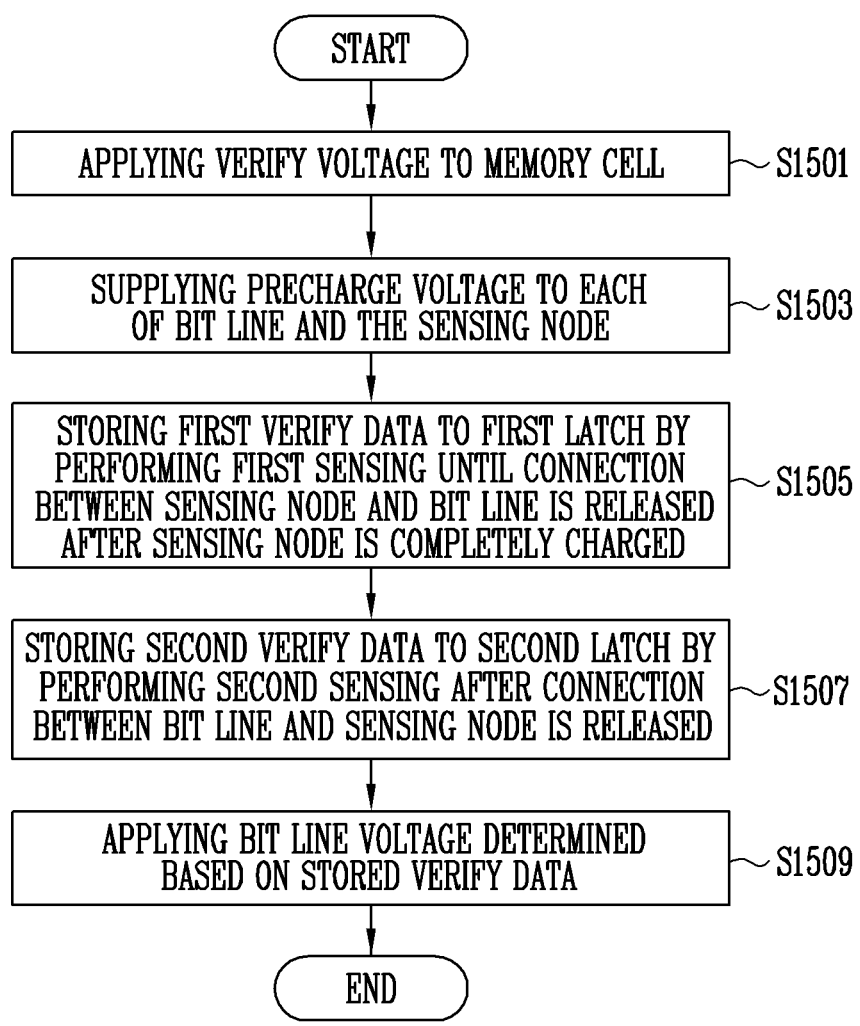
FIG. 15 is a diagram illustrating a method for performing a program verify operation in accordance with an embodiment of the present disclosure.

FIG. 15 is a diagram illustrating a method for performing a program verify operation in accordance with one embodiment of the present disclosure.

The program verify operation in accordance with this embodiment may be performed by the memory device 100, and be performed by the page buffer 1000 included in the memory device 100. FIG. 15 may be considered a detailed embodiment of the step S1403 of determining the program verify pass of the memory cell shown in FIG. 14.

First, in step S1501, the memory device 100 applies a verify voltage to the memory cell. The verify voltage corresponds to the verify voltage Vvfy shown in FIG. 12. In step S1503, the memory device 100 supplies a precharge voltage to each of the sensing node SO of the page buffer 1000 and the bit line. The method for applying the precharge voltage correspond to the description of the bit line voltage supply 1003 and the sensing node voltage supply 1007, shown in FIGS. 10 and 11, and FIG. 12.

In step S1505, the memory device 100 stores, in the first latch, the first verify data determined according to the voltage of the sensing node until before the connection between the bit line and the sensing node is released (t2) after the sensing node is completely charged (t1). In step S1507, the memory device 100 stores, in the second latch, the second verify data determined according to the voltage of the sensing node, after the connection between the bit line and the sensing node is released (t2). The steps S1505 and S1507 correspond to the description of the sensing node connector 1005, the sensing node voltage supply 1007, and the verify data storage 1009, shown in FIGS. 10 and 11, and FIG. 12.

In step S1509, the memory device 100 applies, to the bit line, a bit line voltage determined based on whether the first verify data and the second verify data correspond to the off-cell data or the on-cell data, in a next program loop. The bit line voltage applied in the next program loop corresponds to the description shown in FIGS. 9 and 13.

Figure 16:
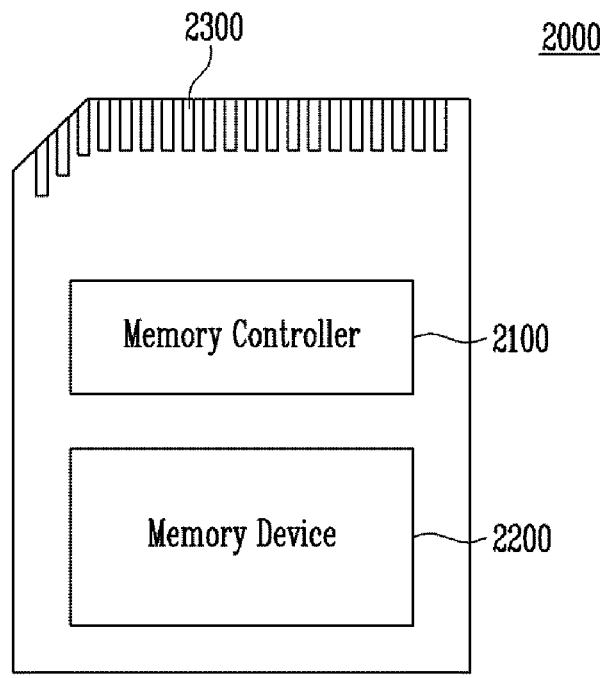
FIG. 16 is a block diagram illustrating a memory card system to which the storage device is applied in accordance with an embodiment of the present disclosure.

FIG. 16 is a block diagram illustrating a memory card system to which the storage device is applied in accordance with one embodiment of the present disclosure.

Referring to FIG. 16, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, program, erase, and background operations of the memory device 2200. The memory controller 2100 provides an interface between the memory device 2200 and a host such as host 300 in FIG. 1. The memory controller 2100 drives instructions (e.g., firmware) for controlling the memory device 2200. The memory controller 2100 may be implemented identically to the memory controller 200 described with reference to FIG. 1.

In one embodiment, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. The memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. Exemplarily, the connector 2300 may be defined by at least one of the above-described various communication protocols.

In one embodiment, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

In one embodiment, the memory controller 2100 and the memory device 2200 may be integrated into a single semiconductor device, to constitute a memory card. The memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 17:
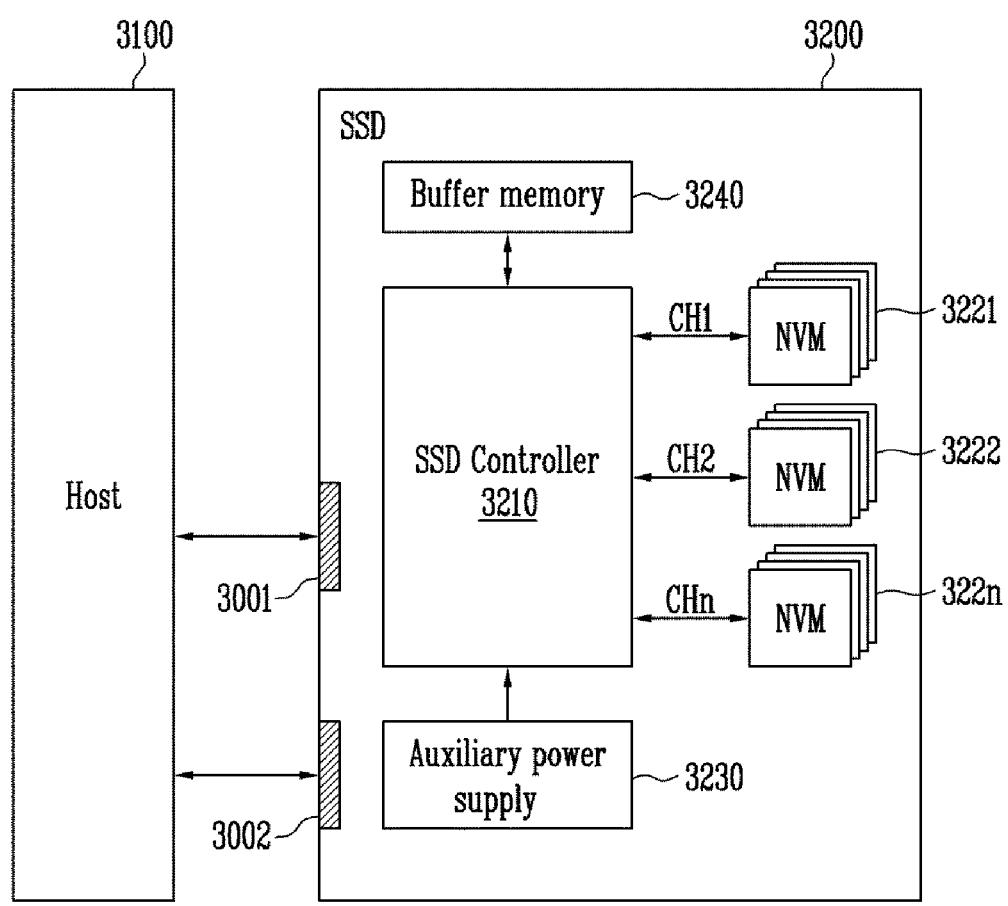
FIG. 17 is a block diagram illustrating a Solid State Drive (SSD) system to which the storage device is applied in accordance with an embodiment of the present disclosure.

FIG. 17 is a block diagram illustrating a Solid State Drive (SSD) system to which the storage device is applied in accordance with an embodiment of the present disclosure.

Referring to FIG. 17, the SSD system 3000 includes a host 3100 and an SSD 3200. The SSD 3200 exchanges a signal with the host 3100 through a signal connector 3001, and receives power through a power connector 3002. The SSD 3200 includes an SSD controller 3210, a plurality of flash memories 3221 to 322n, an auxiliary power supply 3230, and a buffer memory 3240.

In one embodiment, the SSD controller 3210 may serve as the memory controller 200 described with reference to FIG. 1.

The SSD controller 3210 may control the plurality of flash memories 3221 to 322n in response to a signal received from the host 3100. The signal may be a signal based on an interface between the host 3100 and the SSD 3200. The signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power of the SSD 3200. The auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 18:
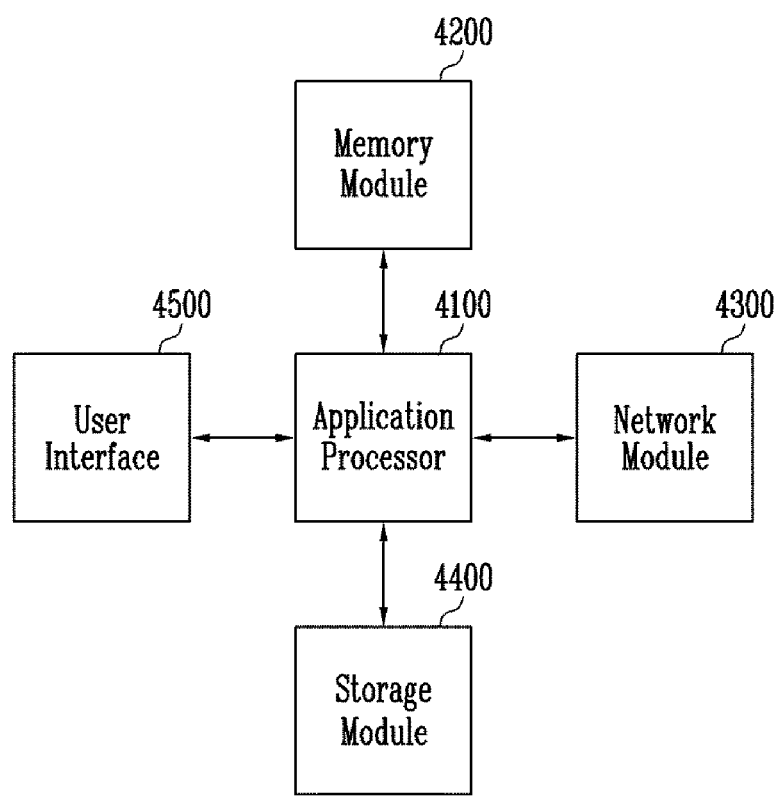
FIG. 18 is a block diagram illustrating a user system to which the storage device is applied in accordance with an embodiment of the present disclosure.

FIG. 18 is a block diagram illustrating a user system to which the storage device is applied in accordance with one embodiment of the present disclosure.

Referring to FIG. 18, the user system 4000 includes an application processor 4100, a memory module 4200, a network module 4300, a storage module 4400, and a user interface 4500.

The application processor 4100 may drive components included in the user system 4000, an operating system (OS), a user program, or the like. The application processor 4100 may include for example controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 4100 and the memory module 4200 may be provided as one semiconductor package by being packaged based on a Package on Package (PoP).

The network module 4300 may communicate with external devices. The network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 4300 may be included in the application processor 4100.

The storage module 4400 may store data. For example, the storage module 4400 may store data received from the application processor 4100. Alternatively, the storage module 4400 may transmit data stored therein to the application processor 4100. The storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 4400 may be provided as a removable drive such as a memory card of the user system 4000 or an external drive.

In one embodiment, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. The user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a memory device having improved reliability and an improved operation speed, and an operating method of the memory device.

While the present disclosure has been shown and described with reference to various embodiments thereof, it will be understood by those skilled in the art that various changes in form and details may be made therein without departing from the spirit and scope of the present disclosure as defined by the appended claims and their equivalents. Therefore, the scope of the present invention should not be limited to the above-described.

In the above-described embodiments, all steps may be selectively performed or part of the steps may be omitted. In the various embodiments, the steps are not necessarily performed in accordance with the described order and may be rearranged. The embodiments disclosed in this specification and drawings are only examples to facilitate an understanding of the present disclosure, and the present invention is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments, and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a memory cell;
   a page buffer connected to the memory cell through a bit line; and
   a program operation controller configured to control an operation of the page buffer,
   wherein the page buffer includes:
   a bit line voltage supply configured to provide a precharge voltage to the bit line while a verify voltage is applied to the memory cell;
   a sensing node voltage supply configured to provide a sensing node precharge voltage to a sensing node connected to the bit line corresponding to providing of the precharge voltage;
   a first latch configured to store first verify data determined according to a voltage level of the sensing node, before connection between the bit line and the sensing node is released after providing of the sensing node precharge voltage is suspended;
   a sensing node connector configured to release the connection between the bit line and the sensing node, after the first verify data is stored; and
   a second latch configured to store second verify data determined according to the voltage level of the sensing node, before applying of the verify voltage is suspended after the connection between the bit line and the sensing node is released,
   wherein the voltage level of the sensing node is decreased before the connection between the bit line and the sensing node is released after the providing of the sensing node precharge voltage is suspended, and wherein the voltage level of the sensing node is constant before the applying of the verify voltage is suspended after the connection between the bit line and the sensing node is released.

2. The memory device of claim 1, wherein the first latch stores the first verify data determined according to the voltage level of the sensing node, after a first reference time amount elapses from when the sensing node is completely charged.

3. The memory device of claim 2, wherein the second latch stores the second verify data determined according to the voltage level of the sensing node, after a second reference time amount elapses from when the connection between the bit line and the sensing node is released.

4. The memory device of claim 3, wherein the first reference time amount and the second reference time amount are the same.

5. The memory device of claim 3, wherein the first reference time amount is longer than the second reference time amount.

6. The memory device of claim 3, wherein the first reference time amount is shorter than the second reference time amount.

7. The memory device of claim 1, wherein the program operation controller applies, to the bit line, a bit line voltage determined based on whether the first verify data and the second verify data correspond to off-cell data or on-cell data, while a program voltage is applied to the memory cell.

8. The memory device of claim 7,
   wherein the on-cell data means that a threshold voltage of the memory cell is lower than a predetermined reference voltage, and
   wherein the off-cell data means that the threshold voltage of the memory cell is higher than the predetermined reference voltage.

9. The memory device of claim 7, wherein the program operation controller applies zero voltage 0V to the bit line in response to that the first verify data is the on-cell data.

10. The memory device of claim 7, wherein the program operation controller applies a predetermined program allow voltage to the bit line in response to that the first verify data is the off-cell data and the second verify data is the on-cell data.

11. The memory device of claim 7, wherein the program operation controller applies a predetermined program inhibit voltage to the bit line in response to that the first verify data is the off-cell data and the second verify data is the off-cell data.

12. A method for operating a memory device including a memory cell and a page buffer connected to the memory cell through a bit line and including a plurality of latches for storing verify data determined according to a voltage level of a sensing node connected to the bit line, the method comprising:
   applying a verify voltage to the memory cell;
   supplying a precharge voltage to the bit line and a sensing node of the page buffer corresponding to applying of the verify voltage;
   storing, in a first latch, first verify data determined according to the voltage level of the sensing node, until connection between the bit line and the sensing node is released after the sensing node is charged after providing of a sensing node precharge voltage is suspended; and
   storing, in a second latch, second verify data determined according to the voltage level of the sensing node, before the applying of the verify voltage is suspended after the connection between the bit line and the sensing node is released, wherein the voltage level of the sensing node is decreased before the connection between the bit line and the sensing node is released after the providing of the sensing node precharge voltage is suspended, and wherein the voltage level of the sensing node is constant before the applying of the verify voltage is suspended after the connection between the bit line and the sensing node is released.

13. The method of claim 12, wherein, the first verify data determined according to the voltage level of the sensing node is stored in the first latch, after a first reference time amount elapses from when the sensing node is completely charged.

14. The method of claim 13, wherein, the second verify data determined according to the voltage level of the sensing node is stored in the second latch, after a second reference time amount elapses from when the connection between the bit line and the sensing node is released.

15. The method of claim 14, wherein the first reference time amount and the second reference time amount are the same.

16. The method of claim 14, wherein the first reference time amount is longer than the second reference time amount.

17. The method of claim 14, wherein the first reference time amount is shorter than the second reference time amount.

18. The method of claim 12,
further comprising applying, to the bit line, a bit line voltage determined based on whether the first verify data and the second verify data correspond to off-cell data or on-cell data, while a program voltage is applied to the memory cell, wherein the on-cell data means that a threshold voltage of the memory cell is lower than a predetermined reference voltage, and wherein the off-cell data means that the threshold voltage of the memory cell is higher than the predetermined reference voltage.

19. The method of claim 18, wherein the applying includes determining zero voltage 0V as the bit line voltage when the first verify data is the on-cell data.

20. The method of claim 18, wherein the applying includes determining a predetermined program allow voltage as the bit line voltage when the first verify data is the off-cell data and the second verify data is the on-cell data.

21. The method of claim 18, wherein the applying includes determining a predetermined program inhibit voltage as the bit line voltage when the first verify data is the off-cell data and the second verify data is the off-cell data.

22. A page buffer connected to a memory cell through a bit line, the page buffer comprising:
a bit line voltage supply configured to provide a precharge voltage to the bit line while a verify voltage is applied to the memory cell;

a sensing node voltage supply configured to provide a sensing node precharge voltage to a sensing node connected to the bit line corresponding to providing of the precharge voltage;

a first latch configured to store first verify data determined according to a voltage level of the sensing node, before connection between the bit line and the sensing node is released after providing of the sensing node precharge voltage is suspended;

a sensing node connector configured to release the connection between the bit line and the sensing node, after the first verify data is stored; and a second latch configured to store second verify data determined according to the voltage level of the sensing node, before applying of the verify voltage is suspended after the connection between the bit line and the sensing node is released, wherein the voltage level of the sensing node is decreased before the connection between the bit line and the sensing node is released after the providing of the sensing node precharge voltage is suspended, and wherein the voltage level of the sensing node is constant before the applying of the verify voltage is suspended after the connection between the bit line and the sensing node is released.

\* \* \* \* \*